United States Patent
Iisaka et al.

(10) Patent No.: US 10,359,755 B2
(45) Date of Patent: *Jul. 23, 2019

(54) PRODUCTION MANAGEMENT METHOD OF BOARD PRODUCTION LINE

(71) Applicant: FUJI CORPORATION, Chiryu (JP)

(72) Inventors: Jun Iisaka, Nisshin (JP); Shigeto Oyama, Kariya (JP)

(73) Assignee: FUJI CORPORATION, Chiryu (JP)

( * ) Notice: Subject to any disclaimer, the term of this patent is extended or adjusted under 35 U.S.C. 154(b) by 269 days.

This patent is subject to a terminal disclaimer.

(21) Appl. No.: 15/228,604

(22) Filed: Aug. 4, 2016

(65) Prior Publication Data

US 2017/0038752 A1 Feb. 9, 2017

(30) Foreign Application Priority Data

Aug. 4, 2015 (JP) ................. 2015-153840

(51) Int. Cl.
*H05K 13/00* (2006.01)
*G05B 19/048* (2006.01)
(Continued)

(52) U.S. Cl.
CPC ............ *G05B 19/048* (2013.01); *G05B 11/01* (2013.01); *G05B 19/4063* (2013.01);
(Continued)

(58) Field of Classification Search
None
See application file for complete search history.

(56) References Cited

U.S. PATENT DOCUMENTS

| 2012/0102726 A1* | 5/2012 | Kaida | ................ H05K 13/0413 29/705 |
| 2014/0200700 A1* | 7/2014 | Kamioka | ......... G05B 19/41875 700/110 |

(Continued)

FOREIGN PATENT DOCUMENTS

| JP | 2009-4714 | 1/2009 |
| JP | 2012-227407 | 11/2012 |

OTHER PUBLICATIONS

U.S. Appl. No. 15/114,537, filed Jul. 27, 2016, Jun Iisaka, et al.

*Primary Examiner* — Paul B Yanchus, III
(74) *Attorney, Agent, or Firm* — Oblon, McClelland, Maier & Neustadt, L.L.P.

(57) ABSTRACT

A production management apparatus of a board production line, which can prevent malfunction of the board production device in a test production process, and appropriately maintain the production environment, including: a permission determination section that, before transition from a test production process, in which the inspection device inspects a regulated number of initial boards produced by the board production device as a target, to a later main production process, determines permission for performing an operation command received by the board production device, based on a detection state and a detection result of an initial board by an inspection device; and a processing management section that controls processing of the operation command in the board production device based on a determination result by the permission determination section.

6 Claims, 4 Drawing Sheets

(51) Int. Cl.
*G05B 19/4063* (2006.01)
*G05B 11/01* (2006.01)
*G05B 19/418* (2006.01)
*H05K 13/08* (2006.01)

(52) U.S. Cl.
CPC ... *G05B 19/41875* (2013.01); *H05K 13/0857* (2018.08); *G05B 2219/45026* (2013.01); *Y02P 90/22* (2015.11)

(56) References Cited

U.S. PATENT DOCUMENTS

2015/0089801 A1* 4/2015 Cho .................. H05K 13/0417
                                                              29/705
2016/0209207 A1* 7/2016 Kim .................. G01B 11/0608

* cited by examiner

| No | Board type | Production quantity | Test quantity | Inspection type | Restriction type |
|---|---|---|---|---|---|
| | M1 | | | M2 | |
| 1 | A | 2000 | 1 | Functional testing | L1 |
| 2 | B | 100 | 0 | – | L2 |
| 3 | C | 200 | 2 | Optical inspection | L3 |
| 4 | A | 1000 | 1 | Optical inspection | L3 |
| ⋮ | ⋮ | ⋮ | ⋮ | ⋮ | ⋮ |

PRODUCTION MANAGEMENT METHOD OF BOARD PRODUCTION LINE

TECHNICAL FIELD

The present disclosure relates to a production management method of a board production line that produces boards on which components are mounted.

BACKGROUND ART

As disclosed in PTL 1, a board production line is configured of a board production device, an inspection device and the like. Board production devices perform various types of production processing with respect to a board, and include solder printing machines, component mounters, reflow machines, and the like. Inspection devices inspect boards produced by the board production device, and include solder inspection devices, optical inspection devices, functional testers, and the like. With respect to boards produced by the board production line, appropriate inspection is performed by the inspection devices. For example, with respect to the board which is at the final step of a production process, whether the board functions correctly is tested by the functional tester (refer to PTL 2).

In addition, in the board production line, in a case where a job is switched according to a production plan, before performing a main production process of mass-producing the boards, there is a case where a test production process of producing initial boards is performed. In the test production process, a given quantity of initial boards is produced, and various types of inspection set in advance are performed. There are cases where initial boards are produced as dedicated boards used only for the inspection, and there are cases where initial boards are produced as a portion of production boards while also being used for inspection. By inspection in the test production process, it is determined whether the component types, control program, and parameters set at the board production line are appropriate. The board production line adjusts the board production device and the like based on the determination result.

CITATION LIST

Patent Literature

PTL 1: JP-A-2012-227407
PTL 2: JP-A-2009-004714

SUMMARY

Here, board production devices that configure the board production line can receive an operation command by an operator in the middle of performing the test production process. Therefore, there is a concern that the main production process will be mistakenly started before determining the quality of the initial board by the test production process. If this occurs, in a case where it is determined that the initial board is defective by the test production process later, the boards produced to that point become useless, and loss is generated. In addition, when the parameters or the like are changed according to an operation command in the middle of performing the test production process, there is a concern that the production environment will not be maintained when changeover is performed.

Considering such a situation, an object of the present disclosure is to provide a production management method of a board production line that prevents malfunction of a board production device in a test production process, and appropriately maintains the production environment.

A production management method that manages board production of a board production line includes a board production device that performs various types of production processing with respect to the board and an inspection device that inspects the produced board, the production management method including: a permission determination step that, before transition from a test production process, in which the inspection device inspects a given quantity of initial boards produced by the board production device, to a later main production process, determines permission for performing an operation command received by the board production device, based on an inspection state and an inspection result of initial boards inspected by the inspection device and a processing management step that controls processing of the operation command in the board production device based on a determination result by the permission determination step.

With this configuration, the permission for performing the operation command received by the board production device is determined by the permission determination step. Accordingly, the processing of the operation command in the board production device is controlled by the processing management step in the test production process. Therefore, malfunction of the board production device is prevented. In addition, processing of an operation command that changes the parameters or the like in the board production device is controlled by the processing management step. Accordingly, the production environment of the board production line configured by changeover is appropriately maintained.

DESCRIPTION OF EMBODIMENTS

Hereinafter, an embodiment of a production management device of a board production line of the present disclosure will be described with reference to the drawings. The board production line is used in manufacturing a board product, such as an integrated circuit.

Embodiment

Overall Configuration of Board Production Line

In the embodiment, board production line 1 is provided with multiple board production devices 10, multiple inspection devices 20, and board conveyance device 30. Board production devices 10 perform various types of production processing with respect to a board. Inspection devices 20 inspect boards produced by board production devices 10. Board conveyance device 30 is configured of a belt conveyor and the like, and consecutively transports boards in the conveyance direction (left-right direction in FIG. 1). In addition, each of the devices 10 and 20 of board production line 1 is connected to be able to communicate with a host computer 40 via a network.

Figure 1:
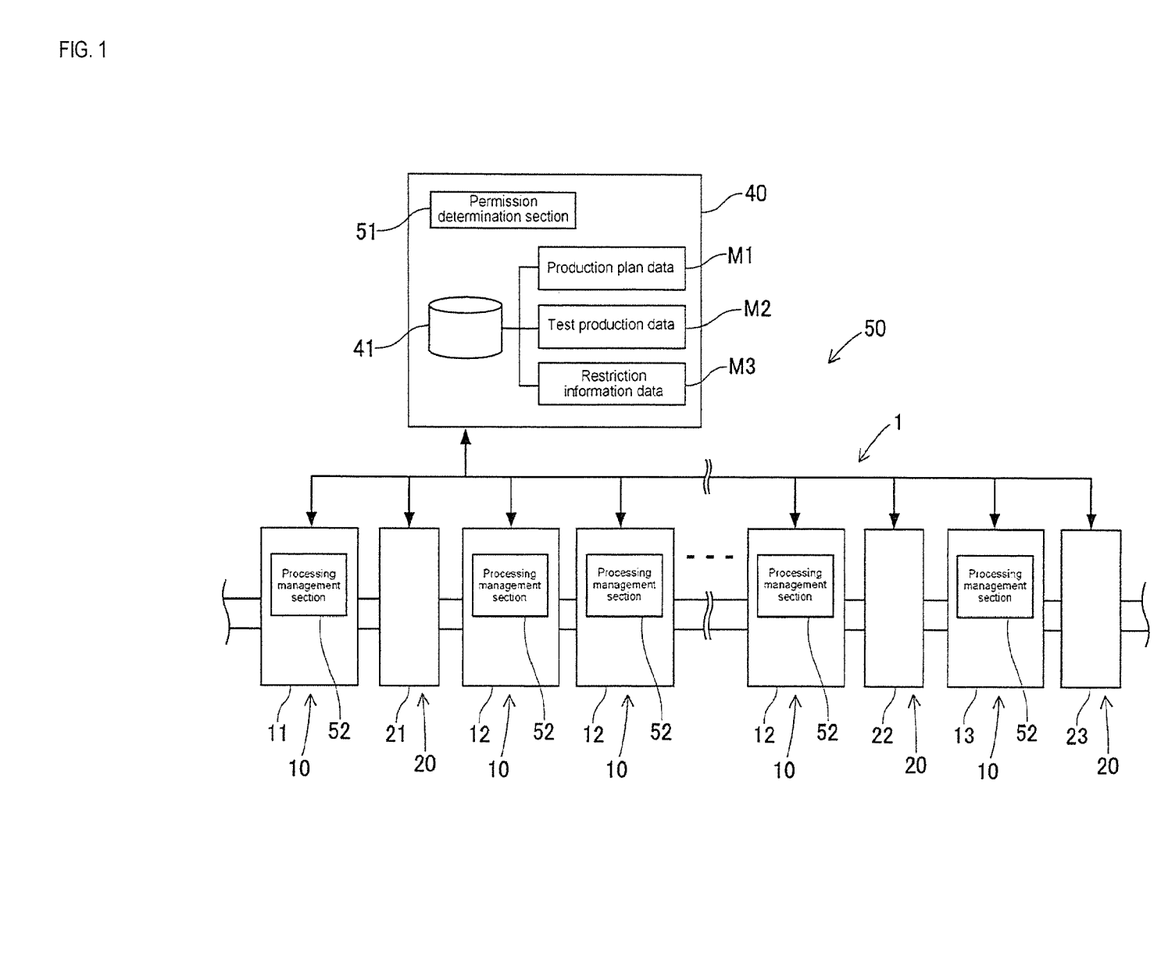
FIG. 1 is a configuration view schematically illustrating an embodiment of the production management device.

In the embodiment, board production line 1 is configured to include screen printer 11, printing inspection device 21, multiple component mounters 12, optical inspection device 22, reflow machine 13, and functional tester 23, in an order from the furthest upstream (head) side in the conveyance direction of the board. Screen printer 11, component mounters 12, and reflow machine 13 are board production devices 10 of board production line 1. Printing inspection device 21, optical inspection device 22, and functional tester 23, are inspection devices 20 of board production line 1.

Screen printer 11 prints solder paste at mounting positions of electronic components on the loaded board. Note that, in the embodiment, screen printer 11 is positioned furthest upstream in board production line 1. Board production line 1 is commanded to perform various types of production processing with respect to the board after a board is loaded into screen printer 11. Specifically, when a board is loaded into screen printer 11 by an on-machine operation or the like of the operator, the printing of the solder is automatically started with the board as a target.

Printing inspection device 21 inspects the printing state of the board on which solder has been printed by screen printer 11. Component mounting machine 12 mounts electronic components on the solder of the board transported from the screen printer 11 side. In the embodiment, multiple component mounters 12 are disposed in the conveyance direction of the board. Optical inspection device 22 inspects the mounting state of electronic components on the board, such as whether the correct electronic components are mounted on the board transported from the component mounter 12 side, the mounting position or the posture of the electronic component, and the like.

Reflow machine 13 heats the board transported from the component mounting machine 12 side, melts the solder on the board, and performs soldering. Functional tester 23 performs functional testing inspection of the soldered board. Specifically, functional tester 23 gives a predetermined input signal to the board, and obtains an output signal corresponding thereto. In addition, functional tester 23 tests whether or not board functionality as an electronic circuit is normal, based on the obtained output signal.

In this manner, board production line 1 produces the board product by transporting the board to board production devices 10 and inspection devices 20, and performing various types of production processing and inspection processing. In addition, the configuration of board production line 1 is appropriately added to and changed corresponding to the board type to be produced and the like. For example, there is also a case where board production line 1 is configured to include aboard supplying device or aboard flipping device, a shield mounting device, an adhesive application device, an ultraviolet ray irradiation device and the like, as another board production device 10.

Host computer 40 monitors an operation situation of board production line 1, and performs control of each of the devices 10, 20, and 30. Host computer 40 has storage device 41 configured of a hard disk, a flash memory, or the like. In storage device 41, various types of data for controlling each of the devices 10, 20, and 30, are stored. Specifically, storage device 41 stores production plan data M1 (refer to FIG. 2) including the type and the quantity of the board to be produced, a control program for operating each of the devices 10, 20, and 30, and so on.

(Overall Configuration of Production Management Device)

As illustrated in FIG. 1, production management device 50 of board production line 1 is provided with permission determination section 51 provided in host computer 40, processing management section 52 provided in each board production device 10, and test production data M2. Permission determination section 51, before transition from a test production process to a later main production process, determines the permission for performing an operation command received by board production device 10, based on the inspection state and the inspection result of an initial board by inspection device 20.

Here, board products are produced by board production line 1 by performing a test production process and a main production process. The "test production process" is a process of producing a given quantity of initial boards determined in advance by board production device 10, and performing specified inspection processing by the inspection device 20 on the initial boards. The "main production process" is a process of mass-producing the same type of board as that of the test production process according to production plan data M1. Note that, board production line 1 is configured as a production environment that corresponds to the board type to be produced by the necessary changeover being performed before the test production process. In addition, there are cases where initial boards are produced as dedicated boards used only for the inspection, and there are cases where initial boards are produced as a portion of production boards while also being used for inspection.

Figure 2:
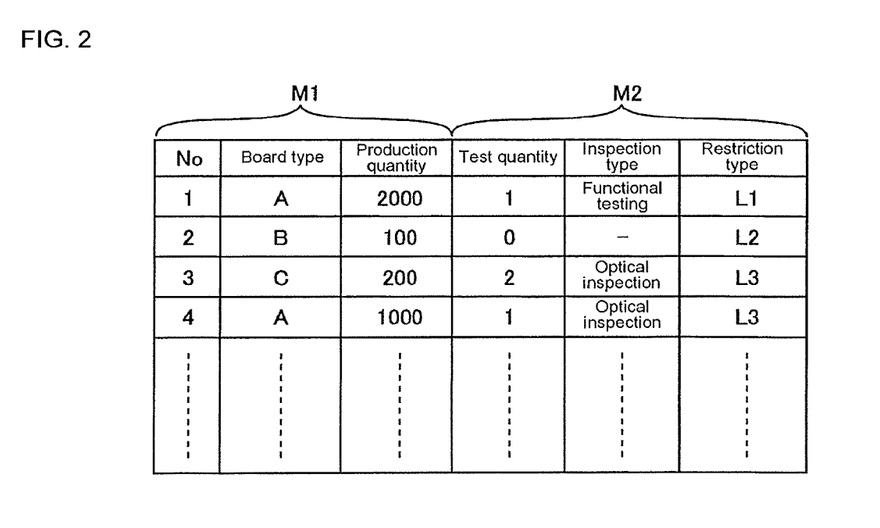
FIG. 2 view illustrating a production plan and test production data.

In addition, the content performed for the test production process is different for each board type produced by board production line 1. In the embodiment, as illustrated in FIG. 2, test production processing is performed based on test production data M2 with which the test quantity, the inspection type, and the restriction type in the test production process are associated for each board type (A, B, and C of FIG. 2) to be produced by the main production process. The "test quantity" of test production data M2 is the quantity of initial boards to be inspected in the test production process, and corresponds to the "given quantity".

The "inspection type" of test production data M2 is the type that corresponds to the inspection result that is finally required in the test production process. In the embodiment, inspection device 20 is any of printing inspection device 21, the optical inspection device 22, and functional tester 23, as described above. Accordingly, in test production data M2, the inspection type which corresponds to any of the inspection devices 20 is set. The test quantity and the inspection quantity are determined, for example, according to the production results of the board type or the degree of change in the production environment due to changeover.

More specifically, in a case where the board to be produced in board production line 1 is new board type A, functional testing is set as the inspection type (No 1 of FIG. 2). In addition, in a case where the same board type A is produced again in the same board production line 1, considering the production result, and the degree of change in the production environment due to changeover, optical inspection is set as the inspection type (No 4 of FIG. 2).

The "restriction type" of test production data M2 indicates the level of restriction to be performed with respect to the operation command received by board production device 10. Here, the "operation command" received by board production device 10 is a command which requires an operation of board production device 10. Specifically, included in operation commands are a load instruction to load a board to board production device 10, a change command to change a parameter related to production processing, and an exchange command to exchange an electronic component set in a component supply device (not illustrated) at component mounting machine 12. Board production device 10 receives the above-described operation command after an on-machine operation is performed by the operator, or after other operation, disposition, or work that leads to the need for operation of board production device 10.

Specific restriction content in the restriction type of the test production data M2 varies according to the type of board production device 10, for example, in type L1, transition to the main production process, exchange of electronic components, and changing parameters, and the like are set to be prevented. Permission determination section 51, before board production line 1 transitions (including the time in the middle of performing the test production process, and in the middle of being on standby of the start of the main production process) from the test production process to the main production process, determines the permission for performing the operation command received by board production device 10, based on the restriction type of test production data M2.

The determination result by permission determination section 51 is stored as restriction information data M3 in storage device 41 of host computer 40 (refer to FIG. 1). Processing management section 52 controls processing of the operation command in board production device 10 based on the determination result by permission determination section 51. Specifically, in a case where board production device 10 receives the operation command by on-machine operation by the operator, processing management section 52 controls whether to perform the processing which corresponds to the operation command with reference to restriction information data M3.

For example in a case where the operator performs an incorrect on-machine operation of starting the main production process in the middle of performing the test production process, permission determination section 51 restricts the performance of the transition processing to the main production process based on restriction information data M3. Meanwhile, for example, in a case where an examination operation of board production device 10 or a confirmation operation of parameters are received in the middle of performing the test production process, permission determination section 51 performs these types of processing based on the restriction information data M3.

(Control of Board Production Device by Production Management Device)

The control of board production device 10 by production management device 50 will be described with reference to FIGS. 2 to 5. Permission determination section 51 of production management device 50 performs determination processing at a certain time, and generates or updates the restriction information data M3. The timing at which the determination processing is performed is before the transition from the test production process to the main production process, for example, the time when changeover has been completed, the time when the inspection result is input from inspection device 20, the time when the notification is received from board production device 10, or the time when a certain period of time has passed from the previous determination processing.

Figure 3:
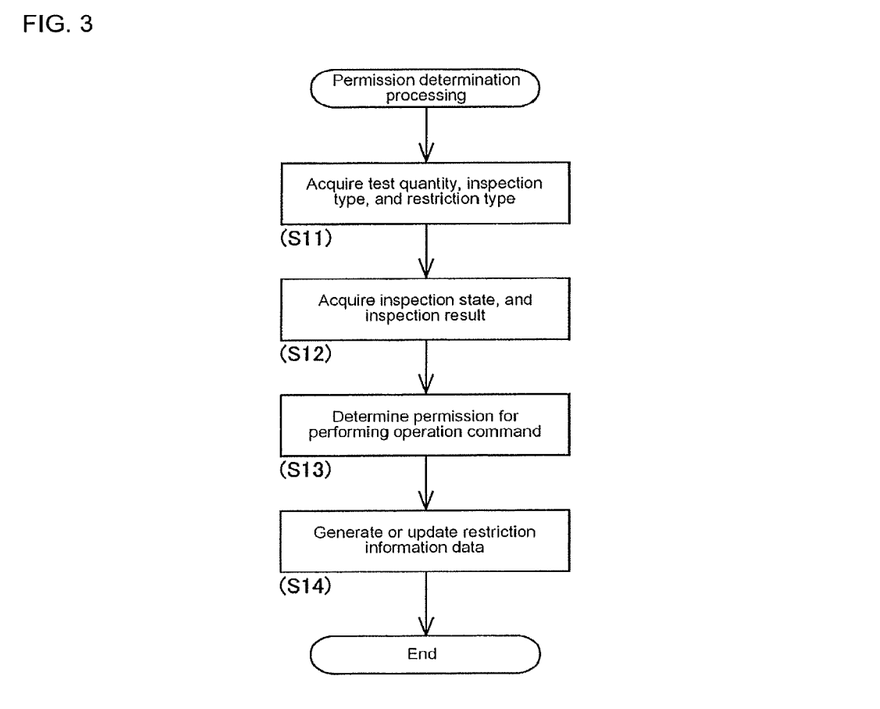
FIG. 3 is a flow chart illustrating permission determination processing by a permission determination section.

Here, according to production plan data M1 illustrated in FIG. 2, a case where board type A is produced (No 1 of FIG. 2) will be described. As illustrated in FIG. 3, permission determination section 51 obtains the test quantity, the inspection type, and the restriction type in the test production process which corresponds to the main production process to be performed next based on the production plan data M1 and the test production data M2 (step 11, [hereinafter, "step" will be written as "S"]). Here, "1" is obtained as the test quantity, "function inspection" is obtained as the inspection type, and "L1" is obtained as the restriction type.

Next, permission determination section 51 obtains the inspection state and the inspection result in the test production process by board production line 1 (S12). Specifically, the inspection state includes whether the initial board is in the middle of production, the quantity of initial boards which have started to be produced and the like. In addition, the inspection result includes the result of the inspection which is finally required, the result of intermediate inspection before the final inspection and the like.

Next, permission determination section 51 determines the permission for performing the operation command received by board production device 10, based on the obtained inspection state and the inspection result (S13). Then, permission determination section 51 generates restriction information data M3 based on the result of the determination (S14). In addition, permission determination section 51 updates the data in a case where the above-described restriction information data M3 is already present (S14).

Specifically, permission determination section 51 determines whether the inspection result obtained by functional tester 23 that performs the inspection of the inspection type "function inspection" designated by the test production data M2 (S13) is accepted. In a case where the test quantity is set to be a plural number, permission determination section 51 performs acceptance determination with respect to the test quantity of initial boards. Based on the determination result and the restriction type "L1", permission determination section 51 generates or updates restriction information data M3 to restrict target operation commands (S14).

Figure 4:
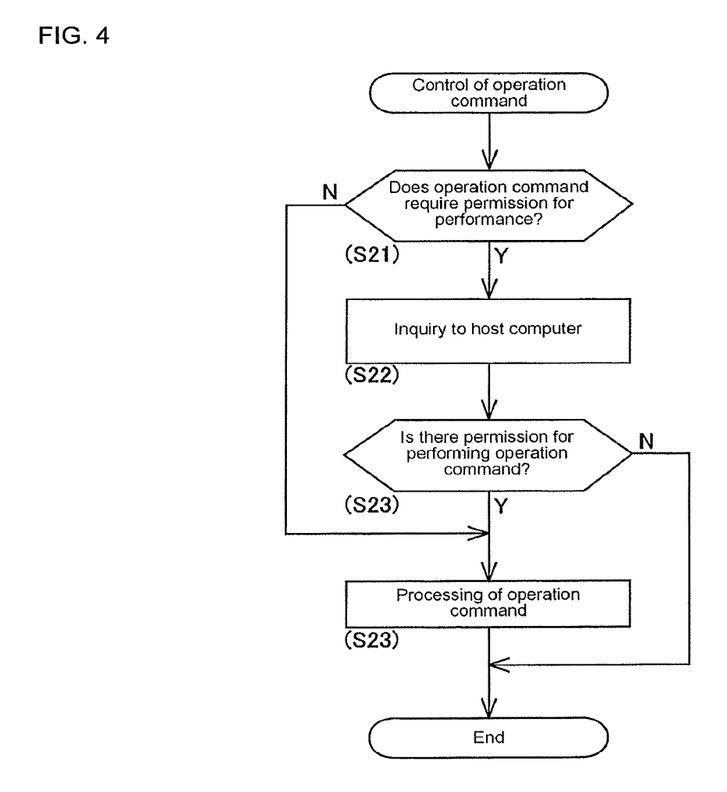
FIG. 4 is a flow chart illustrating control of an operation command by a processing management section.

In addition, in a case where board production device 10 receives an operation command, processing management section 52 of production management device 50 performs control of the processing of the operation command. Specifically, as illustrated in FIG. 4, processing management section 52 determines whether the permission for performance is necessary by permission determination section 51 with respect to the received operation command (S21). For example, in a case where the operation command is, for example, adjusting an illumination lamp or opening and closing a work door, which is not related to the production of the board, processing management section 52 determines that permission is not necessary for the result of the permission determination (S21: No).

Meanwhile, in a case where the received operation command requires permission for performance according to the restriction type (refer to FIG. 2) (S21: Yes), processing management section 52 performs inquiry to host computer 40 (S22). The inquiry includes the content of the received operation command and information which identifies the board production device 10 that received the operation command. Host computer 40 sends out a permission signal or a non-permission signal to board production device 10 to which the inquiry is performed based on the content of the operation command, the restriction information data M3, and the like.

Processing management section 52 determines whether the received signal is a performance permission or a performance non-permission (S23). In a case where the result of the permission determination is not required in the processing of the operation command (S21: No), and in a case where the permission signal is received from the host computer 40 (S23: Ye), processing management section 52 performs the processing of the operation command (S24). Meanwhile, in a case where the non-permission signal is received from host computer 40 (S23: No), the processing of the operation command is restricted so as not to be performed.

Figure 5:
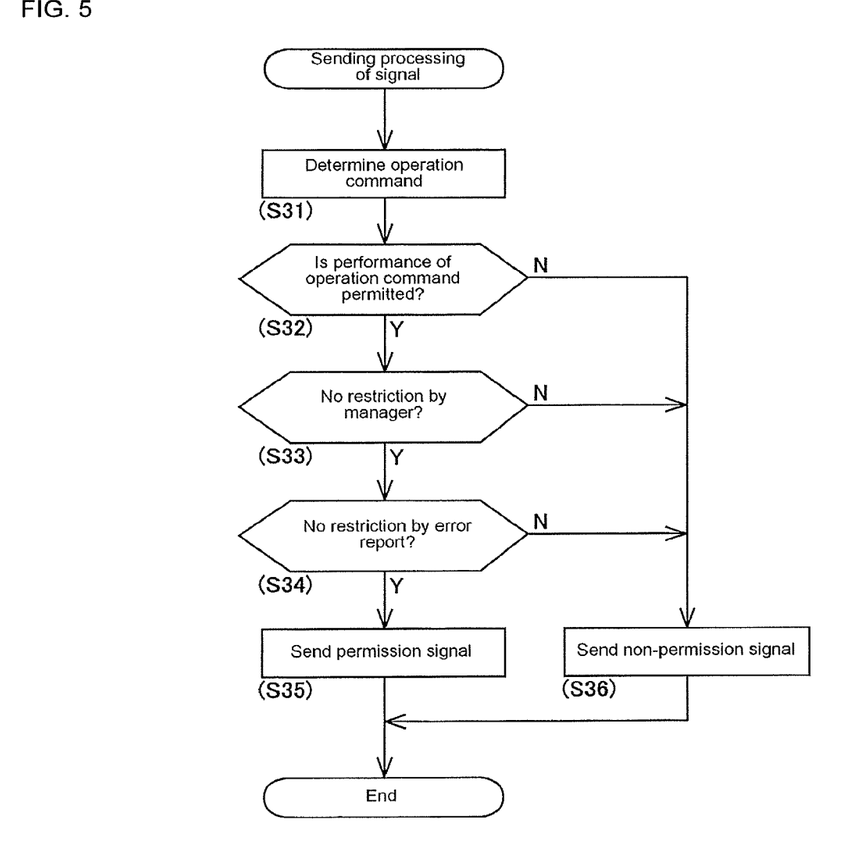
FIG. 5 is a flow chart illustrating sending processing of a permission signal or the like with respect to an operation command in a host computer.

In addition, host computer 40 that receives the inquiry in S22, as described above, sends out the permission signal or the non-permission signal to board production device 10. Specifically, as illustrated in FIG. 5, host computer 40 determines the content of the operation command (S31). In addition, host computer 40 refers to the restriction information data M3 which has already been generated or updated by permission determination section 51 in S14, and extracts the result about the permission for performing the processing of the operation command.

In a case where the result of the extracted performance permission is permission (S32: Yes), host computer 40 determines the presence or the absence of the restriction by a manager of board production line 1 (S33). The manager has authority to integrally manage the production of boards by board production line 1. In a case where, for example, a stop instruction of production or an instruction of invalidating the on-machine operation in board production device 10 is received from the manager (S33: No), host computer 40 sends out the non-permission signal with respect to the processing of the operation command which was the inquiry to board production device 10, regardless of the result of S32 (S36).

Next, in a case where the restriction is not performed by the manager (S33: Yes), host computer 40 performs determination (S34) of the presence or the absence of the restriction by an error report. Here, the "error report" is received by host computer 40 beforehand regarding various errors detected in each of the devices 10, 20, and 30. In a case where it is determined that interruption of the performance of the test production process or transition to the main production process is to be restricted, based on the content by the abnormality report (S34: No), host computer 40 sends out the non-permission signal with respect to the processing of the operation command which was the inquiry to board production device 10, regardless of the result of S33 (S36).

Meanwhile, in a case where the restriction due to the error report is not performed (S34: Yes), such as a case where the content of the error report is minor, or a case where the error which was reported by the manager or a maintenance worker has been cleared, host computer 40 sends out the permission signal with respect to the processing of the operation command to board production device 10 of the inquiry (S35). In a case where the restriction due to the error report is to be performed (S34: No), host computer 40 sends out the non-permission signal with respect to the processing of the operation command which is the inquiry to board production device 10 (S36).

Here, as described above, board production line 1 of the embodiment is considered as being commanded to perform various types of production processing with respect to the board after the board is transported into the screen printer 11 positioned furthest upstream in the conveyance direction of the board. In other words, in board production line 1, after changeover, when boards are consecutively loaded into screen printer 11, the transition to the main production process is achieved. Here, in a case where board production device 10 receives the operation command of loading the board into screen printer 11, processing management section 52 controls the performance of the transport processing of the board by the permission signal or the non-permission signal received from the host computer 40.

For example, in a case where the loading of the board into screen printer 11 is for producing the test quantity of initial boards in the test production process, it is permitted to transport the board into screen printer 11. Meanwhile, after only the test quantity of boards have been transported into screen printer 11 in the test production process, until acceptance determination is performed for the test quantity of produced boards, it is not permitted to load the board into screen printer 11 for transitioning to the main production process. However, in the test production process, for example, in a case where board production device 10 or the like is adjusted based on the inspection result, it is permitted to transport a board into screen printer 11 for additional production of initial boards.

In this manner, processing management section 52 controls the transition processing from the test production process to the main production process by restricting the loading of boards into screen printer 11. In addition, in a case where a board supplying device is at the head of board production line 1, processing management section 52 controls the supply of boards using the board supplying device.

Effect of Embodiment

Production management device 50 according to the embodiment is a device which manages the production of boards by board production line 1. Board production line 1 includes board production devices 10 that perform various types of production processing with respect to the board, and inspection devices 20 that inspect produced boards. Permission determination section 51, before the transition from the test production process in which inspection device 20 performs inspection on the given quantity of initial boards produced by board production device 10 to the later main production process, determines the permission for performing an operation command received by board production device 10, based on the inspection state and the inspection result of the initial boards by inspection device 20. Processing management section 52 controls processing of the operation command in board production device 10 based on the determination result by permission determination section 51.

With this configuration, the permission for performing the operation command received by board production device 10 is determined by permission determination section 51. Accordingly, the processing of the operation command inboard production device 10 is controlled by processing management section 52 before the transition to the main production process. Therefore, malfunction of board production device 10 is prevented. In addition, the processing of an operation command that changes the parameters or the like is controlled by processing management section 52 in board production device 10. Accordingly, the production environment of board production line 1 configured by changeover is appropriately maintained.

In addition, the functional testing that tests the board functionality by inspection device 20 (functional tester 23) is included in the test production process. Permission determination section 51 determines the permission for performing operation commands related to the transition processing from the test production process to the main production process, based on the result of the functional testing considering the given quantity of initial boards.

In board production line 1, for example, in a case where a new board type is produced, there is a case where functional testing is performed of whether the required board functions appropriately in a similar state to the product. However, in a case where functional testing is performed, it takes more time to finish the inspection compared to other inspection. Therefore, in a case where functional testing is included in the inspection types of the test production process, the period from changeover to the start of the main production process becomes long. Then, chances that board production device 10 receives an operation command by on-machine operation by the operator or the like increases. In this state, maintaining the production environment of board production line 1 reliably prevents malfunction, and thus is particularly effective.

In addition, processing management section 52 controls the transition processing from the test production process to the main production process by restricting the transport of boards into board production device 10 (screen printer 11) that is positioned furthest upstream in the conveyance direction of the board in board production line 1.

Board production line 1 of the embodiment is configured such that the start of production of board is taken to be after a board is loaded into screen printer 11 positioned furthest upstream in the conveyance direction of the board. In board production line 1, as processing management section 52 controls the processing of the operation command related to the loading of boards, incorrect transition to the main production process is prevented.

In addition, production management apparatus 50 is provided with, for each board type to be produced by the main production process, test production data M2 which contains the type of the inspection to be performed in the test production process. Permission determination section 51 obtains the inspection type in the test production process which corresponds to the main production process to be performed next from test production data M2, and determines the permission for performing the operation command received by board production device 10, based on the inspection state and the inspection result of the initial board by inspection device 20 that performs the inspection of the inspection type.

With this configuration, permission determination section 51 determines the permission which corresponds to the board type in the production plan with reference to test production data M2. In other words, permission determination section 51 automatically switches whether the determination is performed based on the inspection result by any inspection device 20 according to the content of test production data M2. Accordingly, since the test production process which corresponds to the board type is performed, the production efficiency is improved in board production line 1.

Alternative Embodiments

In the embodiment, production management device 50 is configured to include permission determination section 51 provided in host computer 40, multiple processing management sections 52 which are respectively provided in multiple board production devices 10, and test production data M2 stored in storage device 41. However, if board production devices 10 and inspection devices 20 are able to communicate, permission determination section 51, processing management section 52, and test production data M2 may be provided in an external device other than board production device 10.

In addition, in the embodiment, restriction information data M3 is stored together with test production data M2 the storage device 41. However, restriction information data M3, as an indicator of the result of the permission determination of the operation command of board production device 10, may be stored in board production device 10 with processing management section 52. Accordingly, in a case where board production device 10 receives an operation command, processing management section 52 can control the processing of the operation command with reference to the restriction information data M3 without communicating with host computer 40.

In addition, permission determination section 51 performs the determination processing at a certain timing, and then generates or updates restriction information data M3. Here, after processing management section 52 restricts the processing of the operation command, in a case where the inspection result is updated by inspection device 20, the permission determination section 51 may determine the permission for performing the operation command again. Accordingly, restriction information data M3 is appropriately updated to the latest information. In addition, in a case where permission is performed by permission determination section 51, regarding an operation command restricted in advance, processing management section 52 may be configured to automatically release the restriction with respect to the processing of the operation command.

There are cases where the performance of the operation command received by board production device 10 is not permitted by permission determination section 51, and is restricted to processing management section 52. Accordingly, for example, in a case where the transition processing to the main production process is restricted, the standby state of board production device 10 is maintained. However, according to the content of the operation command, there is a case where the operation command may be performed as the detection result is updated. Here, as described above, a configuration in which the restriction is automatically released based on the result of the permission determination updated by permission determination section 51 is achieved.

Accordingly, the processing of the restricted operation command is performed at appropriate timing. Accordingly, for example, in a case where the standby state of board production device 10 is maintained, restriction information data M3 is updated by determining the acceptance of the test quantity by inspection device 20. In addition, when the restriction of the transition processing to the main production process is released, board production line 1 automatically transitions to the main production process. Accordingly, the standby time of board production device 10 is reduced, and the production efficiency of board production line 1 is improved.

In addition, in the embodiment, permission determination section 51 determines the permission for performing the operation command in advance (S13), regardless of the timing when board production device 10 receives the operation command. However, when board production device 10 receives any operation command, permission determination section 51 may determine the permission for performing the operation command based on production plan data M1 and test production data M2 as necessary. In addition, processing management section 52 controls the processing of the operation command based on the determination result of the permission for performing each operation command. With this configuration, production management device 50 may not be provided with restriction information data M3.

REFERENCE SIGNS LIST

1: board production line, 10: board production device, 11: screen printer, 12: component mounter, 13: reflow machine, 20: inspection device, 21: printing inspection device, 22: optical inspection device, 23: functional tester, 30: board conveyance device, 40: host computer, 41: storage device, 50: production management device, 51: permission determination section, 52: processing management section, M1: production plan data, M2: test production data, M3: restriction information data

The invention claimed is:

1. A production management method that manages board production of a board production line, which includes a board production device that performs various types of production processing with respect to the board and an inspection device that inspects the produced board, the production management method comprising:
    a permission determination step including determining permission for performing an operation command received by the board production device, based on an inspection state and an inspection result of initial boards inspected by the inspection device, the initial boards being produced during a test production process and a quantity of the initial boards produced during the test production process being a test quantity; and
    a processing management step including controlling processing of the operation command in the board production device in a main production process for a production quantity of boards based on a determination result by the permission determination step, the production quantity being greater that the test quantity.

2. The production management method of a board production line, according to claim 1,
    wherein functional testing for testing functionality of the board by the inspection device is included in the test production process, and
    wherein the permission determination step determines permission for performing the operation command of transition processing from the test production process to the main production process, based on a result of the functional testing of the quantity of initial boards.

3. The production management method of a board production line, according to claim 1,
    wherein the processing management step controls transition processing from the test production process to the main production process by restricting loading of the board into the board production device positioned furthest upstream in the board production line in a conveyance direction of the board.

4. The production management method of a board production line, according to claim 1,
    wherein the permission determining step determines the permission for performing the operation command again in a case where the inspection result is updated by the inspection device after the processing managing step restricts the processing of the operation command, and
    wherein the processing management step automatically releases the restriction with respect to the processing of the operation command in a case where the operation command is permitted by the permission determination step.

5. The production management method of a board production line, according to claim 1,
    wherein the production management method includes, for each type of board produced by the main production process, test production data with which a type of the inspection is associated in the test production process and
    wherein the permission determination step obtains from the test production data the inspection type of the test production process which corresponds to the main production process to be performed next, and determines the permission for performing the operation command received by the board production device based on the detection state and the detection result of the initial board by the inspection device which performs the inspection for the inspection type.

6. The production management method of a board production line, according to claim 1,
    wherein the inspection device is a printing inspection device, an optical inspection device, or a functional tester.

* * * * *